United States Patent [19]
Shioda et al.

[11] Patent Number: 5,731,695
[45] Date of Patent: Mar. 24, 1998

[54] VOLTAGE LIMITER CIRCUIT

[75] Inventors: Shinobu Shioda, Yokohama; Kanji Ohsawa, Tokyo, both of Japan

[73] Assignee: Kabushiki Kaisha Toshiba, Kawasaki, Japan

[21] Appl. No.: 314,959

[22] Filed: Sep. 29, 1994

[30] Foreign Application Priority Data

Oct. 1, 1993 [JP] Japan .................................. 5-247034

[51] Int. Cl.$^6$ ........................................... G05F 5/00
[52] U.S. Cl. .................. 323/299; 455/72; 327/310; 333/14; 381/106
[58] Field of Search ..................... 323/299, 303, 323/371; 333/14; 381/106; 455/72, 43, 116; 327/310

[56] References Cited

U.S. PATENT DOCUMENTS

| | | | |
|---|---|---|---|
| 4,642,583 | 2/1987 | Fucito et al. | 333/14 |
| 4,701,722 | 10/1987 | Dolby | 333/14 |
| 5,023,490 | 6/1991 | Gittinger | 307/492 |
| 5,293,139 | 3/1994 | Polonen et al. | 333/14 |

OTHER PUBLICATIONS

Shioda, S. et al., "1.8V CMOS Analog Compander with 80dB Dynamic Range", CCIC '93, pp. 1.1–1.4.
Okamura, "Design of OP Amplifier Circuit, Revised Edition", CQ Shuppan-Sha, Aug. 10, 1973, pp. 179–189.

Primary Examiner—Peter S. Wong
Assistant Examiner—Shawn Riley
Attorney, Agent, or Firm—Banner & Witcoff, Ltd.

[57] ABSTRACT

First and second analogue signal processing circuit has first to fourth input terminals and first and second output terminals, and functions such that the first and second output terminals have an equal potential and that a difference between output currents of the first and second output terminals is proportional to a product obtained by multiplying a potential difference between the first and second input terminals by a potential difference between the third and fourth input terminals. The first input terminal of the first analogue signal processing circuit is supplied with an input signal, and the second input terminal is supplied with ground potential. The third input terminal is supplied with a second reference potential, and the fourth input terminal is supplied with a third reference potential. The first input terminal of the second analogue signal processing circuit is supplied with an output signal from an operational amplifier, and the second input terminal is supplied with the ground potential. The third input terminal is supplied with the second reference potential, and the fourth input terminal is supplied with a potential outputted from a potential generator circuit. The first and second output terminals of the second analogue signal processing circuit are respectively connected to negative and positive input terminals of the operational amplifier. The operation amplifier has an output terminal and negative and positive input terminals respectively supplied with output potentials from the first and second output terminals of the first analogue signal processing circuit.

18 Claims, 5 Drawing Sheets

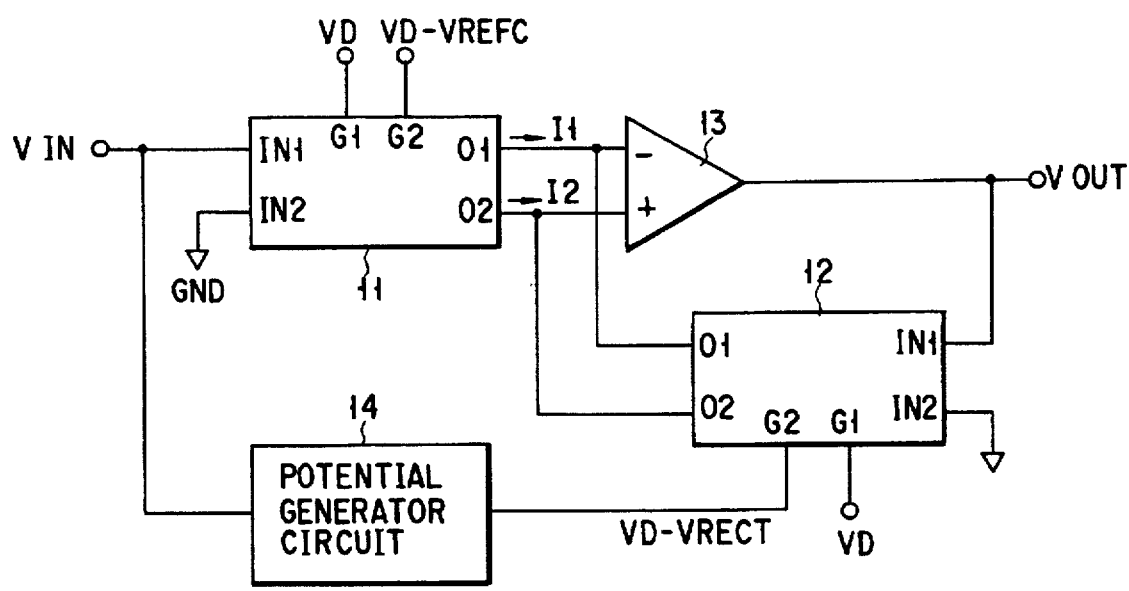
F I G. 2

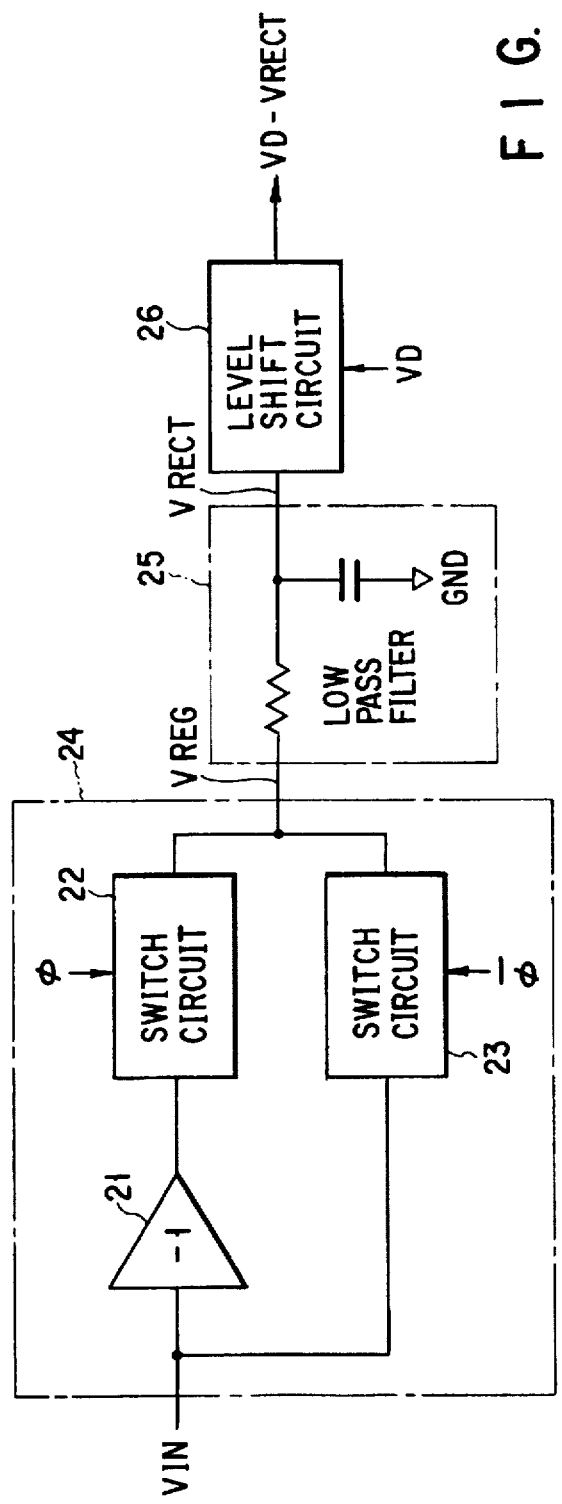
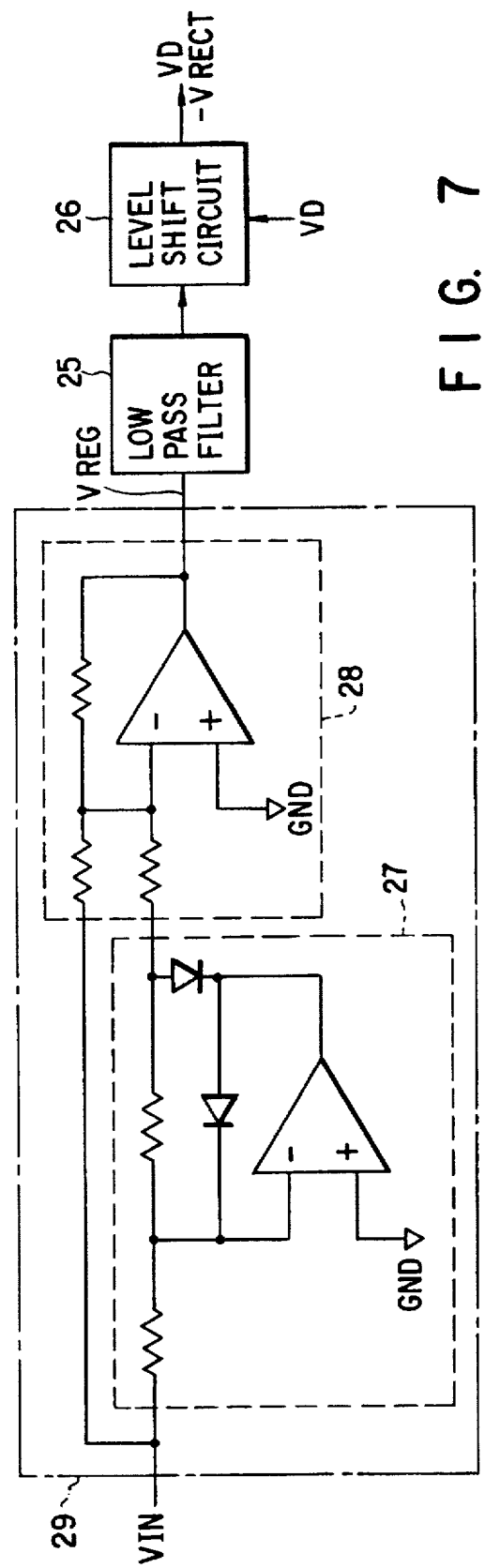

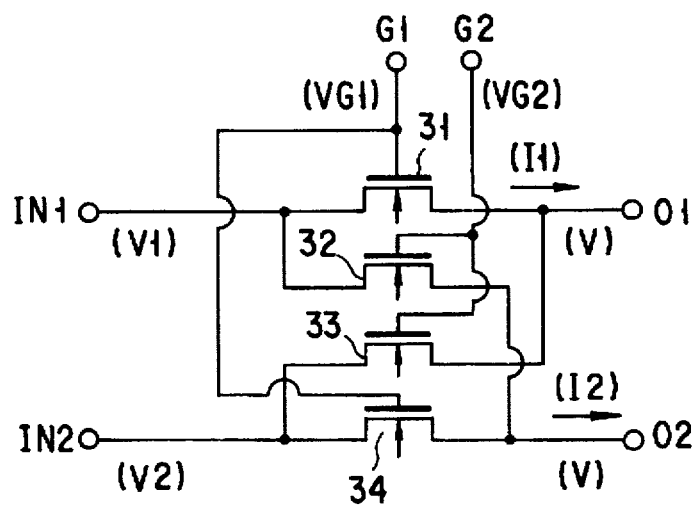
F I G. 8
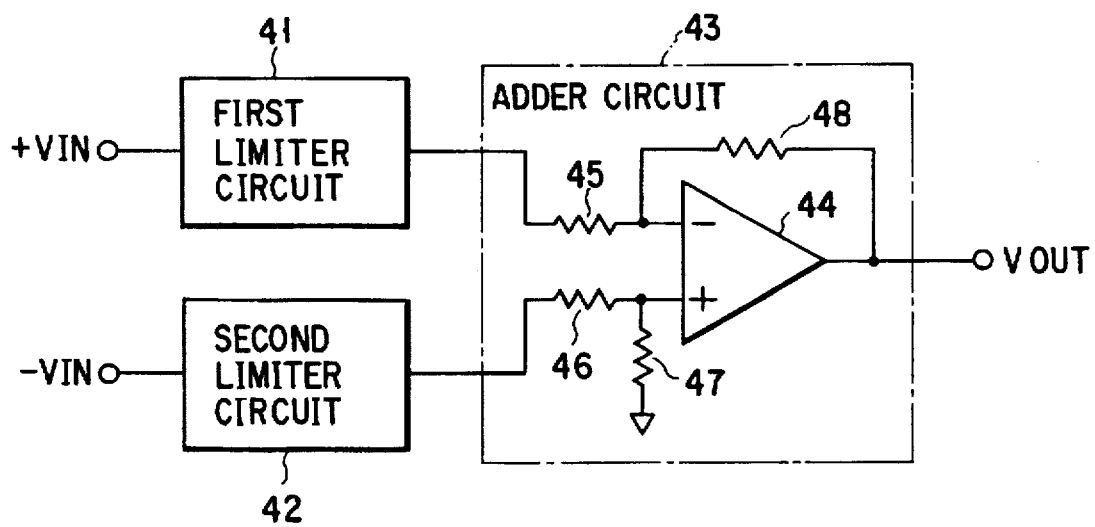
F I G. 9

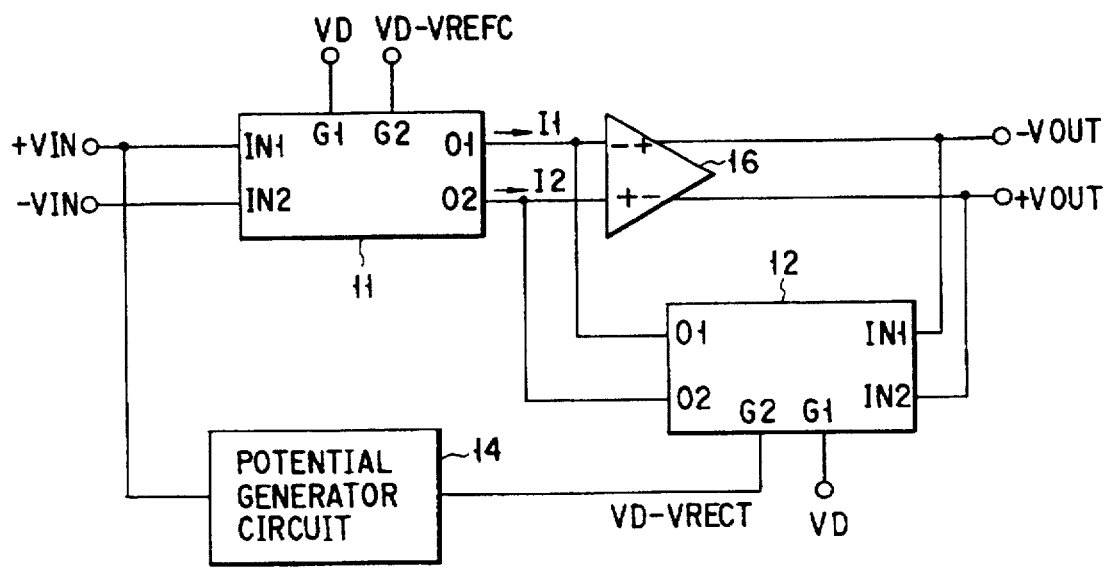
F I G. 10
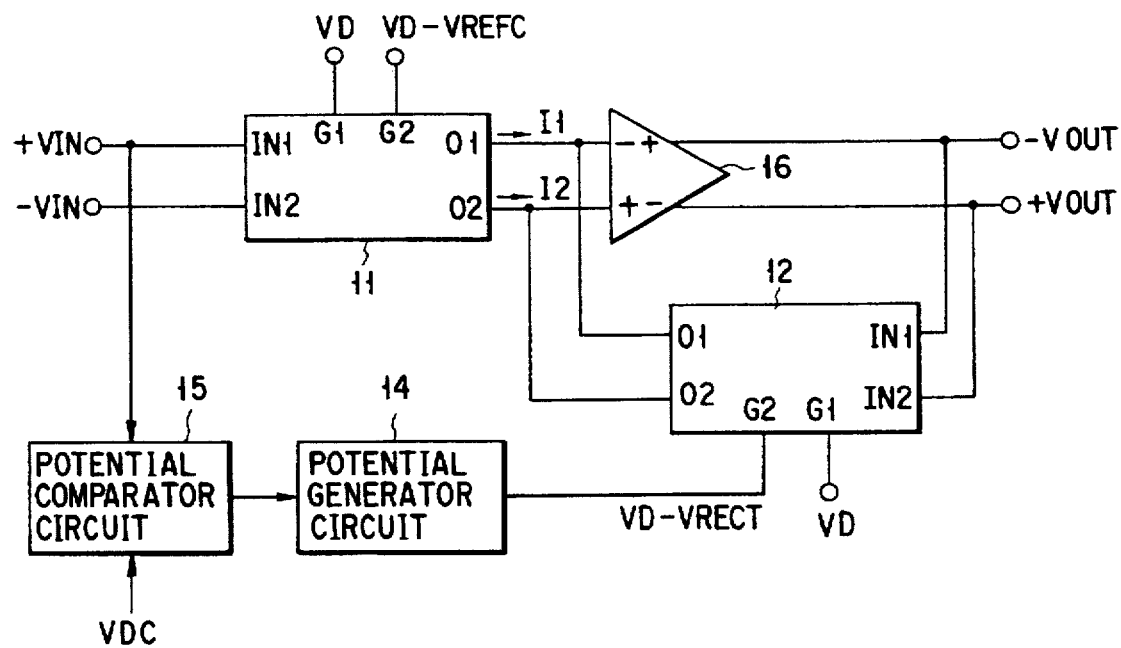
F I G. 11

VOLTAGE LIMITER CIRCUIT

BACKGROUND OF THE INVENTION

1. Field of the Invention

The present invention relates to a voltage limiter circuit for limiting an amplitude of an analogue signal voltage, for use in the fields of communication apparatuses, audio and visual apparatuses, and the like.

2. Description of the Related Art

As a voltage limiter circuit for use in communication and AV fields, there is a well-known conventional circuit disclosed in "Design of OP Amplifier Circuit, Revised Edition" by Okamura, CQ Shuppan-Sha, Aug. 10, 1973, page 182, FIG. 10–5(a). This voltage limiter circuit comprises a differential input type operational amplifier 51, diodes 52 and 53, and a plurality of resistors 54 to 59, as shown in FIG. 1. In this limiter circuit, an input signal VIN is sliced at positive and negative limit levels which are decided depending on values of source voltages +V and −V and resistance values of the resistors 56 to 59, and an output signal VOUT whose amplitude is thus limited can be obtained.

However, since an input signal VIN is thus sliced at positive and negative limit levels, a harmonic distortion occurs in an output signal VOUT. Therefore, a low-pass filter must be provided in a next stage to eliminate the harmonic distortion, so that the entire circuit has a complicated configuration which is a drawback of this kind of voltage limiter circuit. In addition, a conventional circuit has a further drawback that limit levels vary in accordance with changes in source voltages +V and −V.

Further, a conventional circuit has another drawback that integration of a circuit is not easy since diodes are used therein. Specifically, both diodes 52 and 53 whose anodes or cathodes are not connected to any power source must be formed so as to have free electric potentials. However, it is very difficult to form diodes in an LSI manufactured by means of a normal MOS-LSI process, in such a manner in which the diodes are kept potentially free.

SUMMARY OF THE INVENTION

The present invention has been made in view of the above situation, and has an object of providing a voltage limiter circuit which has a simple circuit configuration, which does not generate a distortion in an output signal, and in which limit levels are not influenced by values of source voltages.

According to the present invention, it is possible to provide a voltage limiter circuit comprising: a first analogue signal processing circuit having first to fourth input terminals and first and second output terminals, for functioning such that the first and second output terminals have an equal potential and that a difference between output currents of the first and second output terminals is proportional to a product obtained by multiplying a potential difference between the first and second input terminals by a potential difference between the third and fourth input terminals, the first input terminal being supplied with an input signal, the second input terminal being supplied with a first reference potential, the third input terminal being supplied with a second reference potential, and the fourth input terminal being supplied with a third reference potential; an operational amplifier having an output terminal and negative and positive input terminals respectively supplied with output potentials from the first and second output terminals of the first analogue signal processing circuit, for generating an output signal whose amplitude is limited and outputting the output signal through the output terminal; potential generator means for generating a DC potential having a value proportional to the input signal; and a second analogue signal processing circuit having fifth to eighth input terminals and third and fourth output terminals, for functioning such that the third and fourth output terminals have an equal potential and that a deference between output currents of the third and fourth output terminals is proportional to a product obtained by multiplying a potential difference between the fifth and sixth input terminals by a potential difference between the seventh and eighth input terminals, the fifth input terminal being supplied with the output signal from the operational amplifier, the sixth input terminal being supplied with the first reference potential, the seventh input terminal being supplied with the second reference potential, the eighth input terminal being supplied with the potential output from the potential generator means, and the third and fourth output terminals being respectively connected to the negative and positive input terminals of the operational amplifier.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a block diagram showing an arrangement of a first embodiment of the voltage limiter circuit according to the present invention;

FIG. 6 is a circuit diagram showing a specific arrangement of a potential generator circuit used in the circuits of the first and second embodiments;

FIG. 7 is a circuit diagram showing a specific arrangement of another potential generator circuit;

FIG. 8 is a circuit diagram of an analogue signal processing circuit used in the circuits of the first and second embodiments;

FIG. 9 is a block diagram showing an arrangement of a third embodiment of the voltage limiter circuit according to the present invention;

FIG. 10 is a block diagram showing an arrangement of a fourth embodiment of the voltage limiter circuit according to the present invention; and FIG. 11 is a block diagram showing an arrangement of a fifth embodiment of the voltage limiter circuit according to the present invention.

DETAILED DESCRIPTION OF THE PREFERRED EMBODIMENTS

Figure 1:
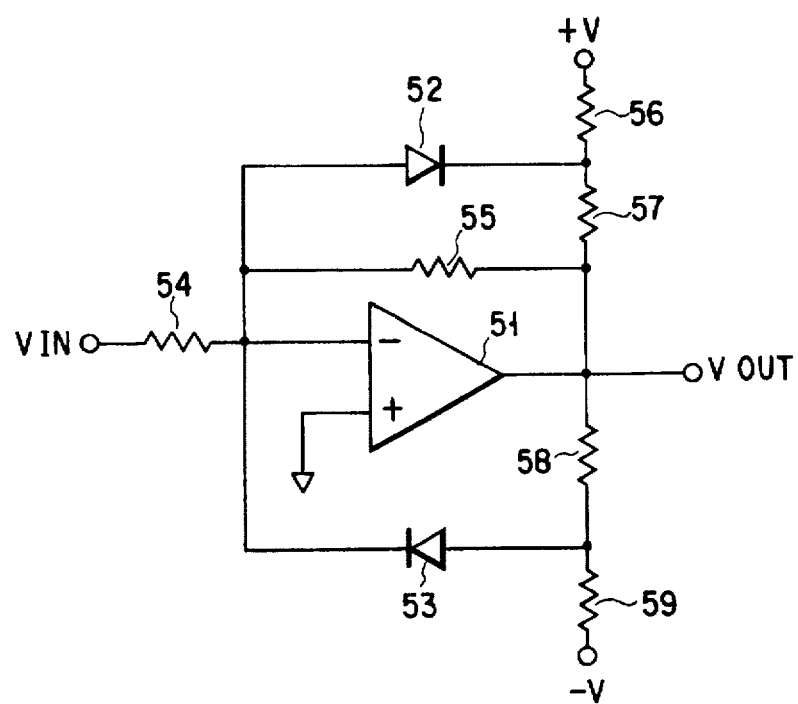
FIG. 1 is a diagram showing a circuit configuration of a conventional voltage limiter circuit.

In the following, the present invention as well as embodiments thereof will be explained with reference to the drawings.

A voltage limiter circuit according to a first embodiment of the present invention invention is shown in FIG. 2, and this circuit comprises first and second analogue signal processing circuits 11 and 12, a differential-input type operational amplifier 13, and a potential generator circuit 14.

The first analogue signal processing circuit 11 has a first input terminal IN1, a second input terminal IN2, a third input terminal G1, a fourth input terminal G2, a first output terminal O1, and a second output terminal O2. Likewise, the other analogue signal processing circuit 12 has a fifth input terminal IN1, a sixth input terminal IN2, a seventh input terminal G1, an eighth input terminal G2, a third output terminal O1 and a fourth output terminal O2.

The first analogue signal processing circuit 11 functions such that the first and second output terminals O1 and O2 have an equal electric potential and that a difference between currents of the first and second output terminals O1 and O2 is proportional to a product obtained by multiplying a potential difference between the first and second input terminals IN1 and IN2 by a potential difference between the third and fourth input terminals G1 and G2. The other analogue signal processing circuit 12 has the same internal circuit configuration as that of the first circuit 11, and functions such that the third and fourth output terminals O1 and O2 have an equal electric potential and that a difference between currents of the third and fourth output terminals O1 and O2 is proportional to a multiplication result obtained by multiplying a potential difference between the fifth and sixth input terminals IN1 and IN2 by a potential difference between the seventh and eighth input terminals G1 and G2.

In both of the analogue signal processing circuits 11 and 12, supposing that a difference in currents between the first and second output terminals O1 and O2 as well as a difference in currents between the third and fourth output terminals O1 and O2 is commonly expressed as (I1–I2); a potential difference between the first and second input terminals IN1 and IN2 as well as a potential difference between the fourth and fifth input terminals IN1 and IN2 is commonly expressed as (V1–V2); and a potential difference the third and fourth input terminals IN1 and IN2 as well as a potential difference between seventh and eighth input terminals IN1 and IN2 is commonly expressed as (VG1–VG2), it assumes that the following formula exists.

$$(I1-I2) = m(V1-V2) \cdot (VG1-VG2) \quad (1)$$

where m is a proportionality content.

In the first analogue signal processing circuit 11 provided in the input side of an operational amplifier 13, an input signal VIN is supplied to the first input terminal IN1, a first reference potential is supplied to the second input terminal IN2, a second reference potential is supplied to the third input terminal G1, and a third reference potential (VD-VREFC) is supplied to the fourth input terminal G2. Further, signals from the first and second output terminals O1 and O2 are respectively supplied to the negative and positive input terminal of the operational amplifier 13. As the first reference potential, for example, an analogue grounding potential GND is supplied to the second input terminal IN2, and a DC potential VD as the second potential is supplied to the third input terminal G1.

In the above potential generator circuit 14, the input signal VIN is rectified and smoothened thereby to generate a DC potential VRECT proportional to the input signal VIN, and further, the level of the potential VRECT is shifted from a predetermined DC potential VD, thereby to generate a DC potential (VD-VRECT). Note that the potential VD of the potential generator circuit 14 is equal to the second reference potential supplied to the third input terminal G1 of the first analogue signal processing circuit 11.

In the second analogue signal processing circuit 12 provided in the output side of the operation amplifier 13, the fifth input terminal IN1 is supplied with an output signal VOUT from the above operational amplifier 13, the sixth input terminal IN2 is supplied with a fourth reference potential, the seventh input terminal G1 is supplied with the second reference potential VD, and the eighth input terminal G2 is supplied with the output potential (VD-VRECT) of the above potential generator circuit 14. As the fourth reference potential, the analogue grounding potential GND stated above is supplied to the sixth input terminal IN2. Signals from the third and fourth output terminals O1 and O2 of the second analogue signal processing circuit 12 are respectively supplied to the negative and positive input terminals of the operational amplifier 13.

In a voltage limiter circuit having an arrangement as stated above, a negative feed back is applied to the amplifier 13 through the second analogue signal processing circuit 12. Therefore, the operational amplifier 13 is virtually kept grounded, so that the potentials of negative and positive input terminals of the operational amplifier 13 can be considered as being equal each other and being equal to the analogue grounding potential GND. Further, the operation amplifier 13 generally has a very high input impedance, so that an input current flowing into the operation amplifier 13 can be considered as being substantially zero. Therefore, the following formula (2) is obtained by applying the relation expressed by the above formula (1) to the first analogue signal processing circuit 11 in the input side.

$$\begin{aligned}(I1-I2) &= m(V1-V2) \cdot (VG1-VG2) \\ &= m(VIN-0) \cdot \{VD-(VD-VREFC)\} \\ &= m \cdot VIN \cdot VREFC \end{aligned} \quad (2)$$

Likewise, the following formula (3) is obtained by applying the relation of the formula (1) to the second analogue signal processing circuit 12 in the output side.

$$\begin{aligned}-(I1-I2) &= m(V1-V2) \cdot (VG1-VG2) \\ &= m(VOUT-0) \cdot \{VD-(VD-VRECT)\} \\ &= m \cdot VOUT \cdot VRECT \end{aligned} \quad (3)$$

The following formula (4) is obtained from the above formulas (2) and (3).

$$-VIN \cdot VREFC = VOUT \cdot VRECT \quad (4)$$

The above formula (4) can be solved for VOUT, supposing that VRECT=k·VIN exists since VRECT is a DC potential obtained by rectifying VIN and is proportional to VIN. As a result, VOUT can be obtained as follows.

$$VOUT = -VRECT/k \quad (5)$$

As can be seen from the formula (5), VOUT does not depend on VIN but is a constant value, so that it is possible to attain a limiter characteristic corresponding to the set value of the reference potential VRECT.

Figures 3A, 3B:
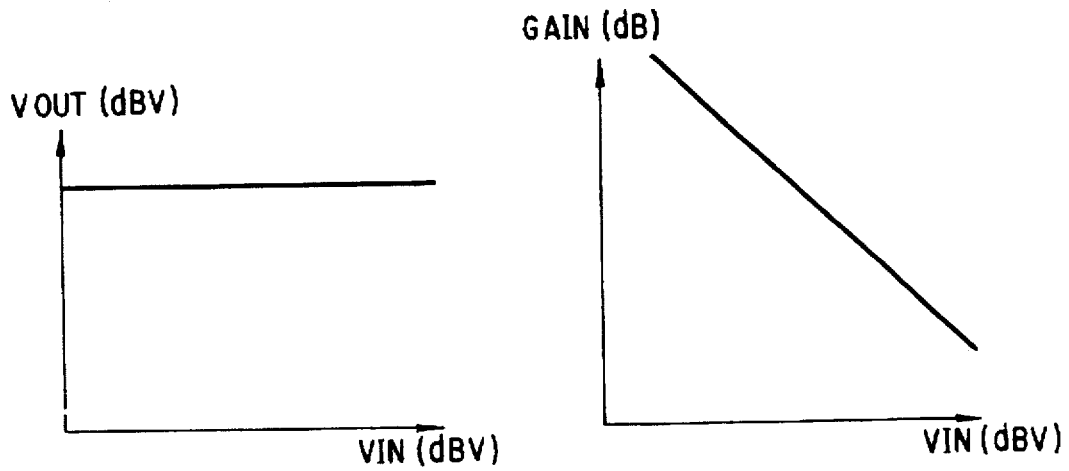
FIG. 3A is a graph showing an input/output characteristic of the circuit according to the first embodiment shown in FIG. 2.
FIG. 3B is a graph showing a gain characteristic of the circuit according to the first embodiment shown in FIG. 2.

FIG. 3A is a characteristic graph showing an input/output relationship between an output signal VOUT (dBV) and an input signal VIN (dBV) of the circuit according to the embodiment shown in FIG. 2. FIG. 3B is a characteristic graph showing a relationship between a gain (dB) and an input signal VIN (dBV) of the same circuit. As is apparent from FIG. 3A, the output signal VOUT does not depend on the input signal VIN but is a constant value, and thus, a stable limiter characteristic can be obtained.

Thus, in the above embodiment, an output amplitude is limited by changing a gain in response to an input signal VIN, without slicing the input signal VIN at any level. It is therefore possible to prevent occurrence of a harmonic distortion in an output signal, as in a conventional. In addition, the circuit of the present invention does not require any distortion removing circuit such as a low pass filter, which otherwise must be provided in a next stage as in a conventional circuit. Further, as represented by the above formula (5), a parameter expressing a source voltage is not included in the formula expressing VOUT. Thus, in the circuit of this embodiment, a gain is not influenced by changes in source voltage, and the limiter characteristic is not influenced, either.

Figure 4:
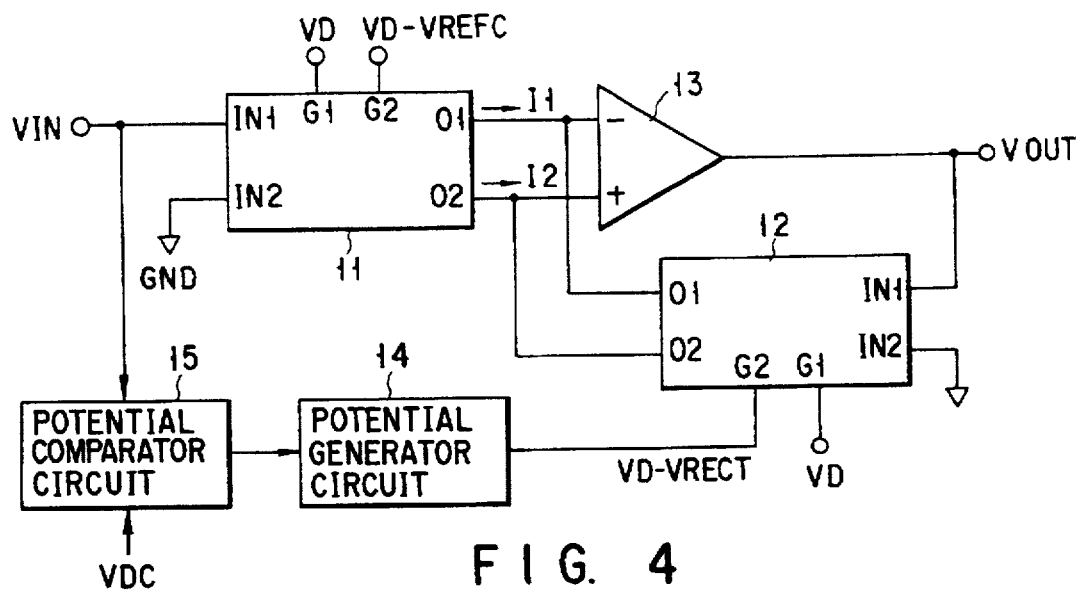
FIG. 4 is a block diagram showing an arrangement of a second embodiment of the voltage limiter circuit according to the present invention.

FIG. 4 shows a voltage limiter circuit according to a second embodiment, which additionally includes a comparator circuit 15. The comparator circuit 15 is provided in a stage prior to the potential generator circuit 14, and this circuit 15 compares the potential of the input signal VIN to a predetermined DC potential VDC, and outputs a greater one of these two potentials to the potential generator circuit 14.

In a limiter circuit having the structure as stated above, the potential generator circuit 14 is not sensitive within a range where the value of an input signal is equal to or lower than the DC potential VD, and as a result, the output signal VOUT is obtained by the following formula (6) in response to an input signal VIN equal to or lower than VDC.

$$VOUT=-(VREFC/VDC) \cdot VIN \qquad (6)$$

Figures 5A, 5B:
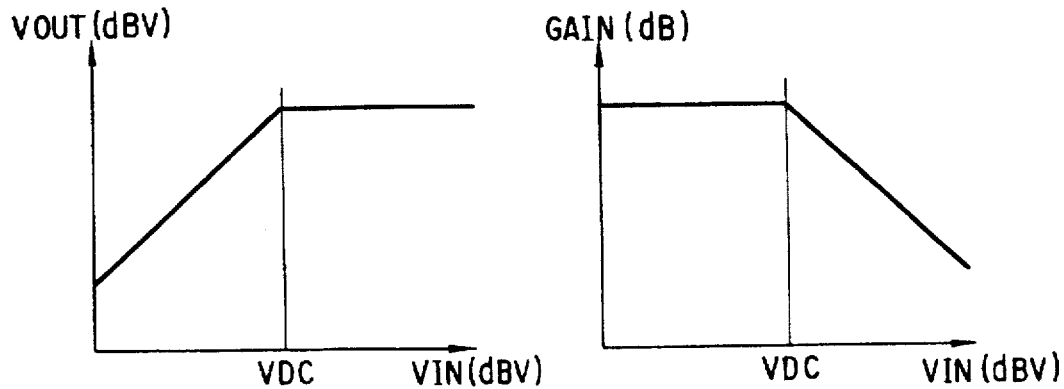
FIG. 5A is a graph showing an input/output characteristic of the circuit according to the second embodiment shown in FIG. 4.
FIG. 5B is a graph showing a gain characteristic of the circuit according to the second embodiment shown in FIG. 4.

FIG. 5A shows an input/output relationship between an output signal VOUT (dBV) and an input signal VIN (dBV) in the circuit according to the second embodiment. Another relationship between a gain (dB) and an input signal VIN (dBV) is shown in FIG. 5B. As shown in FIG. 5B, the gain is constant within a range where the value of an input signal VIN is equal to or lower than the DC potential VDC, and as shown in FIG. 5A, the level of an output signal VOUT is proportional to an input signal VIN within the same range. After the value of an input signal VIN exceeds the DC potential VDC, a limit characteristic corresponding to the set value of the potentials VREFC and VDC are obtained.

FIGS. 6 and 7 show specific circuit configurations of the potential generator circuit 14 used in the above circuits of first and second embodiment. The potential generator circuit 14 shown in FIG. 6 includes a full wave rectifier circuit 24 consisting of an inversion circuit 21 for inverting an input signal VIN, a switch circuit 22 into which an output of the inversion circuit 21 is inputted and which is rendered conductive on the basis of a control signal φ activated during a period in which the input signal VIN is a value of negative polarity, and a switch circuit 23 into which the input signal VIN is inputted, which has an output node commonly connected with an output node of the switch circuit 22, and which is rendered conductive on the basis of a control signal $\bar{\phi}$ activated during a period in which the input signal VIN is a value of positive polarity. A signal VREG obtained by the full wave rectifier circuit 24 is smoothened by a low pass filter thereby generating a DC potential VRECT proportional to the input signal VIN. The DC potential VRECT is supplied to a level shift circuit 26 in which the level Of the potential VRECT is shifted from a predetermined DC potential VD, thereby generating a potential (VD-VRECT).

Another potential generator circuit 14 shown in FIG. 7 is provided with a full wave rectifier circuit 29 in which a half wave rectifier circuit 27 consisting of a differential-input type operational amplifier, diodes and resistors is coupled with an inversion amplifier circuit 28 consisting of a differential-input type operational amplifier and a plurality of resistors. A signal VREG obtained by the full wave rectifier circuit 29 is smoothened by a low pass filter 25 as in the case of FIG. 6, thereby generating a DC potential VRECT proportional to an input signal VIN. Further, the level of the potential VRECT is shifted from a predetermined DC potential VD, by a level shift circuit 26, and a potential (VD-VRECT) is thereby generated.

In the following, explanation will be made to specific configurations of the first and second analogue signal processing circuits 11 and 12 which are used in the circuits according to the first and second embodiments. These analogue signal processing circuits have functions as has been described above. A typical example of these analogue signal processing circuits is disclosed in, for example, Zdzislaw Czarnul, "Novel MOS resistive Circuit for Synthesis of Fully Integrated Continuous-time Filters", Proceeding of IEEE 1986, vol. cas-33, No. 7, July 1986. The circuit configuration of this example is shown in FIG. 8.

This circuit comprises first to fourth MOS transistors 31 to 34 each of which has an equal size and an equal polarity, for example, of N-channel. One of a source and a drain of the first MOS transistor 31 is commonly connected with one of a source and a drain of the second MOS transistor 32. The first or fifth input terminal IN1 stated above is provided at the connection point common to the first and second MOS transistors. One of a source and a drain of the third MOS transistor 33 is commonly connected with one of a source and a drain of the fourth MOS transistor 34. The second or sixth input terminal IN2 stated above is provided at the connection point common to the third and fourth MOS transistors. The other one of a source and a drain of the first MOS transistor 31 is commonly connected with the other one of a source and a drain of the third MOS transistor 33. The first or third sixth output terminal O1 stated above is provided at the connection point common to the first and third MOS transistors. The other one of a source and a drain of the second MOS transistor 32 is commonly connected with the other one of a source or a drain of the fourth MOS transistor 34. The second or fourth output terminal O2 stated above is provided at the connection point common to the second and fourth MOS transistors.

The gate of the first MOS transistor 31 is commonly connected with the gate of the fourth transistor 34. The third or seventh input terminal G1 is provided at the connection point common to the gates of the first and fourth MOS transistors. In addition, the gate of the second MOS transistor 32 is commonly connected with the gate of the third MOS transistor 33. The fourth or eighth input terminal G2 is provided at the connection point common to the gates of the second and third MOS transistors.

It is well-known that a source-drain current IDS of a MOS transistor in a non-saturation region is generally obtained by the following formula, where a gate-source voltage is VGS, a threshold voltage is VTH, and a drain-source voltage is VDS.

$$IDS=K\{2(VGS-VTH) \cdot VDS-VDS^2\}^2 \qquad (7)$$

Where K is a proportional constant, μ is a mobility of effective carriers in the MOS transistor, COX is a capacity for a unit area of a gate oxide film, W is a channel width, and L is a channel length. K is expressed as ½·μ·COX(W/L).

If it is supposed that the first to fourth transistors 31 to 34 have an equal size and are all operated in a non-saturation region, these transistors satisfy the relationship defined by the formula (1) described before and this relationship does not depend on threshold voltages VTH of the MOS transistors 31 to 34. Further, if the threshold voltage of each MOS transistor is decreased to enlarge a range within which the transistors can be operated in a non-saturation region, the MOS transistors can be operated at a low voltage without deteriorating characteristics, so that application for portable devices driven by small batteries can be very facilitated.

Since each of the first and second analogue signal processing circuits 11 and 12 is thus comprised of four MOS transistors and further since a low pass filter need not be provided as in the above cases, the circuit configuration is simplified in comparison with a conventional circuit. In addition, since diodes which are not suitable for circuit-integration are not used unlike in a conventional circuit, the circuit of the present invention can be easily integrated.

FIG. 9 shows a voltage limiter circuit of a third embodiment which is provided with first and second limiter circuits 41 and 42. Each of these first and second limiter circuits 41 and 42 may have either the arrangement shown in FIG. 2 which comprises the first and second analogue signal processing circuits 11 and 12, the operational amplifier 13, and the potential generator circuit 14 or the arrangement shown in FIG. 4 which comprises the first and second analogue signal processing circuits 11 and 12, the operational amplifier 13, the potential generator circuit 14, and the comparator circuit 15. A complemented signal consisting of a signal +VIN and a signal −VIN is supplied to the limiter circuits 41 and 42, such that the first limiter circuit 41 is supplied with a signal +VIN as an input signal and the second limiter circuit 42 is supplied with another signal −VIN as an input signal.

Output signals from these first and second limiter circuits 41 and 42 are supplied to an adder circuit 43. This adder circuit 43 comprises a differential-input type operational amplifier 44 and four resistors 45 to 48, as shown in the figure. The output signal of the first limiter circuit 41 is supplied to a negative input terminal (−) of the operational amplifier 44 through the resistor 45, while the output signal of the second limiter circuit 42 is supplied to a positive input terminal (+) of the operational amplifier 44 through the resistor 46. The above resistor 47 is connected between the positive input terminal of the operational amplifier 44 and an analogue grounding potential GND. The resistor 48 serves as a feedback resistor for the operational amplifier 44, and is connected between the negative input terminal and an output terminal thereof. An output signal VOUT is outputted from the output terminal of the operational amplifier 44. In the circuit of this embodiment, gain control is carried out by the first and second limiter circuits 41 and 42 such that predetermined limiter characteristics are respectively attained for input signals +VIN and −VIN which complement each other. Thereafter, the adder circuit 43 inverses the output signal of the first limiter circuit 41 and adds the inverted output signal to the output signal of the second limiter circuit 42, to obtain an output signal VOUT.

FIG. 10 shows a voltage limiter circuit according to the fourth embodiment of the present invention, in which the circuit of the embodiment shown in FIG. 2 is modified such that a complemented signal consisting of +VIN and −VIN is used as an input signal and output signals +VOUT and −VOUT are outputted in response to the input signal. Therefore, the circuit of FIG. 10 is different from that of FIG. 2 in that a differential-input/differential-output type operational amplifier 16 is provided in place of a differential-input type operational amplifier 13. In the following explanation, those portions of FIG. 10 which are the same as those of FIG. 2 are designated by the same references as those used in FIG. 2, except for the operational amplifier 16.

A first input terminal IN1 of the first analogue signal processing circuit 11 is supplied with an input signal +VIN and a second input terminal IN2 thereof is supplied with another input signal −VIN. The input signal +VIN is also supplied to the potential generator circuit 14. An output signal −VOUT of the operational amplifier 16 is supplied to the fifth input terminal IN1 of the second analogue signal processing circuit 12, and another output signal +VOUT of the amplifier 16 is supplied to the sixth input terminal IN2 of the circuit 12.

In the structure stated above, complementary output signals +VOUT and −VOUT which have predetermined limiter characteristics can be obtained in response to complementary input signals +VIN and −VIN.

FIG. 11 shows a voltage limiter circuit according to a fifth embodiment of the present invention. In this limiter circuit, the comparator circuit 15 for comparing a potential of the signal +VIN to a DC potential VDC is provided in a preceding stage before the potential generator circuit 14, as in the circuit according to the embodiment shown in FIG. 4, so that the potential generator circuit 14 has an insensitive band.

As has been described above, according to the present invention, it is possible to provide a voltage limiter circuit which has a simple circuit configuration, which does not generate a harmonic distortion in an output signal, and in which limit levels are not influenced by the value of a source voltage.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A voltage limiter circuit comprising:
  a first analogue signal processing circuit having first to fourth input terminals and first and second output terminals, for functioning such that said first and second output terminals have an equal potential and that a difference between output currents of said first and second output terminals is proportional to a product obtained by multiplying a potential difference between said first and second input terminals by a potential difference between said third and fourth input terminals, said first input terminal being supplied with an input signal, said second input terminal being supplied with a first reference potential, said third input terminal being supplied with a second reference potential, and said fourth input terminal being supplied with a third reference potential;
  an operational amplifier having an output terminal and negative and positive input terminals respectively supplied with output potentials from said first and second output terminals of said first analogue signal processing circuit, for generating an output signal whose amplitude is limited and outputting the output signal through said output terminal;

a potential generator circuit for generating a DC potential having a value proportional to the input signal; and a second analogue signal processing circuit having fifth to eighth input terminals and third and fourth output terminals, for functioning such that said third and fourth output terminals have an equal potential and that a difference between output currents of said third and fourth output terminals is proportional to a product obtained by multiplying a potential difference between said fifth and sixth input terminals by a potential difference between said seventh and eighth input terminals, said fifth input terminal being supplied with the output signal from said operational amplifier, said sixth input terminal being supplied with the first reference potential, said seventh input terminal being supplied with the second reference potential, said eighth input terminal being supplied with the potential output from said potential generator circuit, and said third and fourth output terminals being respectively connected to said negative and positive input terminals of said operational amplifier.

2. A voltage limiter circuit according to claim 1, further comprising a potential comparator circuit for comparing a potential of the input signal to a predetermined DC potential and for outputting a greater one of these two potentials to said potential generator circuit.

3. A voltage limiter circuit according to claim 1, wherein each of said first and second analogue signal processing circuits includes first to fourth MOS transistors each of which has a source, a drain, and a gate and which have an equal size and an equal polarity, one of said source and drain of said first MOS transistor is connected to one of said source and drain of said second MOS transistor, one of said source and drain of said third MOS transistor is connected to one of said source and drain of said fourth MOS transistor, the other one of said source and drain of said first MOS transistor is connected to the other one of said source and drain of said third MOS transistor, the other one of said source and drain of said second MOS transistor is connected to the other one of said source and drain of said fourth MOS transistor, said gate of said first MOS transistor is connected to said gate of said fourth MOS transistor, and said gate of said second MOS transistor is connected to said gate of said third MOS transistor.

4. A voltage limiter circuit according to claim 1, wherein said potential generator circuit includes a rectifier for rectifying the input signal, and a potential difference generator circuit for generating a potential corresponding to a potential difference between the second reference potential and an output potential of said rectifier.

5. A voltage limiter circuit according to claim 4, wherein said rectifier is a full wave rectifier circuit.

6. A voltage limiter circuit according to claim 4, wherein said potential difference generator circuit is a level shift circuit.

7. A voltage limiter circuit comprising:

a first analogue signal processing circuit having first to fourth input terminals and first and second output terminals, for functioning such that said first and second output terminals have an equal potential and that a difference between output currents of said first and second output terminals is proportional to a product obtained by multiplying a potential difference between said first and second input terminals by a potential difference between said third and fourth input terminals, said first input terminal being supplied with one of complementary input signals, said second input terminal being supplied with the other one of the complementary input signals, said third input terminal being supplied with a first reference potential, and said fourth input terminal being supplied with a second reference potential;

an operational amplifier having negative and positive output terminals and negative and positive input terminals respectively supplied with output potentials from said first and second output terminals of said first analogue signal processing circuit, for generating output signals whose amplitudes are limited and for respectively outputting the output signals through said negative and positive output terminals, respectively;

a potential generator circuit for generating a DC potential having a value proportional to the one of the complementary input signals; and a second analogue signal processing circuit having fifth through eighth input terminals and third and fourth output terminals, for functioning such that said third and fourth output terminals have an equal potential and that a difference between output currents of said third and fourth output terminals is proportional to a product obtained by multiplying a potential difference between said fifth and sixth input terminals by a potential difference between said seventh and eighth input terminals, said fifth input terminal being supplied with the output signal from said positive output terminal of said operational amplifier, said sixth input terminal being supplied with the output signal from said negative output terminal of said operational amplifier, said seventh input terminal being supplied with the first reference potential, said eighth input terminal being supplied with the output potential from said potential generator circuit, and said third and fourth output terminals being respectively connected to said negative and positive input terminals of said operational amplifier.

8. A voltage limiter circuit according to claim 7, flier comprising a potential comparator circuit for comparing a potential of the one of the complementary input signals to a predetermined DC potential and for outputting a greater one of these two potentials to said potential generator circuit.

9. A voltage limiter circuit according to claim 7, wherein each of said first and second analogue signal processing circuits includes first to fourth MOS transistors each of which has a source, a drain, and a gate and which have an equal size and an equal polarity, one of said source and drain of said first MOS transistor is connected to one of said source and drain of said second MOS transistor, one of said source and drain of said third MOS transistor is connected to one of said source and drain of said fourth MOS transistor, the other one of said source and drain of said first MOS transistor is connected to the other one of said source and drain of said third MOS transistor, the other one of said source and drain of said second MOS transistor is connected to the other one of said source and drain of said fourth MOS transistor, said gate of said first MOS transistor is connected to said gate of said fourth MOS transistor, and said gate of said second MOS transistor is connected to said gate of said third MOS transistor.

10. A voltage limiter circuit according to claim 7, wherein said potential generator circuit includes a rectifier for rectifying the input signal, and a potential difference generator circuit for generating a potential corresponding to a potential difference between the first reference potential and an output potential of said rectifier.

11. A voltage limiter circuit according to claim 10, wherein said rectifier is a full wave rectifier circuit.

12. A voltage limiter circuit according to claim 10, wherein said potential difference generator circuit is a level shift circuit.

13. A voltage limiter circuit comprising first and second limiter circuits, and an adder circuit for inverting one of output signals of said first limiter and second limiter circuits and for adding the inverted one of the output signals to the other one of output signals, said first limiter circuit including:

a first analogue signal processing circuit having first to fourth input terminals and first and second output terminals, for functioning such that said first and second output terminals have an equal potential and that a difference between output currents of said first and second output terminals is proportional to a product obtained by multiplying a potential difference between said first and second input terminals by a potential difference between said third and fourth input terminals, said first input terminal being supplied with one of positive and negative complementary input signals, said second input terminal being supplied with a first reference potential, said third input terminal being supplied with a second reference potential, and said fourth input terminal being supplied with a third reference potential;

a first operational amplifier having an output terminal and negative and positive input terminals respectively supplied with output potentials from said first and second output terminals of said first analogue signal processing circuit, for generating a first output signal whose amplitude is limited through said output terminal;

a first potential generator circuit for generating a DC potential of a value proportional to the one of the positive and negative complementary input signals; and a second analogue signal processing circuit having fifth through eighth input terminals and third and fourth output terminals, for functioning such that said third and fourth output terminals have an equal potential and that a difference between output currents of said third and fourth output terminals is proportional to a product obtained by multiplying a potential difference between said fifth and sixth input terminals by a potential difference between said seventh and eighth input terminals, said fifth input terminal being supplied with the output signal from said first operational amplifier, said sixth input terminal being supplied with the first reference potential, said seventh input terminal being supplied with the second reference potential, said eighth input terminal being supplied with the potential outputted from said first potential generator circuit, and said third and fourth output terminals being respectively connected to said negative and positive input terminals of said first operational amplifier, and said second limiter circuit including:

a third analogue signal processing circuit having ninth to twelfth input terminals and fifth and sixth output terminals, for functioning such that said fifth and sixth output terminals have an equal potential and that a difference between output currents of said fifth and sixth output terminals is proportional to a product obtained by multiplying a potential difference between said ninth and tenth input terminals by a potential difference between said eleventh and twelfth input terminals, said ninth input terminal being supplied with the other one of positive and negative complementary input signals, said tenth input terminal being supplied with the first reference potential, said eleventh input terminal being supplied with the second reference potential, and said twelfth input terminal being supplied with the third reference potential;

a second operational amplifier having an output terminal and negative and positive input terminals respectively supplied with output potentials from said fifth and sixth output terminals of said third analogue signal processing circuit, for generating a second output signal whose amplitude is limited through said output terminal;

a second potential generator circuit for generating a DC potential of a value proportional to the other one of the positive and negative complementary input signals; and a fourth analogue signal processing circuit having thirteenth to sixteenth input terminals and seventh and eighth output terminals, for functioning such that said seventh and eighth output terminals have an equal potential and that a difference between output currents of said seventh and eighth output terminals is proportional to a product obtained by multiplying a potential difference between said thirteenth and fourteenth input terminals by a potential difference between said fifteenth and sixteenth input terminals, said thirteenth input terminal being supplied with the output signal from said second operational amplifier, said fourteenth input terminal being supplied with the first reference potential, said fifteenth input terminal being supplied with the second reference potential, said sixteenth input terminal being supplied with the potential outputted from said second potential generator circuit, and said seventh and eighth output terminals being respectively connected to said negative and positive input terminals of said second operational amplifier.

14. A voltage limiter circuit according to claim 13, wherein each of said first to fourth analogue signal processing circuits includes first to fourth MOS transistors each of which has a source, a drain, and a gate and which have an equal size and an equal polarity, one of said source and drain of said first MOS transistor is connected to one of said source and drain of said second MOS transistor, one of said source and drain of said third MOS transistor is connected to one of said source and drain of said fourth MOS transistor, the other one of said source and drain of said first MOS transistor is connected to the other one of said source and drain of said third MOS transistor, the other one of said source and drain of said second MOS transistor is connected to the other one of said source and drain of said fourth MOS transistor, said gate of said first transistor is connected to said gate of said fourth MOS transistor, and said gate of said second MOS transistor is connected to said gate of said third MOS transistor.

15. A voltage limiter circuit according to claim 13, wherein each of said first and second potential generator circuits includes a rectifier for rectifying the input signal, and a potential difference generator circuit for generating a potential corresponding to a potential difference between the second reference potential and an output potential of said rectifier.

16. A voltage limiter circuit according to claim 15, wherein said recitifer is a full wave rectifier circuit.

17. A voltage limiter circuit according to claim 15, wherein said potential difference generator circuit is a level shift circuit.

18. A voltage limiter circuit according to claim 13, further comprising:

a first potential comparator circuit for comparing a potential of the one of the complementary input signals to a predetermined DC potential and for outputting a greater one of these two potentials to said first potential generator circuit; and a second potential comparator circuit for comparing a potential of the other one of the complementary input signals to a predetermined DC potential and for outputting a greater one of these two potentials to said second potential generator circuit.

* * * * *